(12) United States Patent  (10) Patent No.: US 8,921,818 B2
Tu et al.  (45) Date of Patent: Dec. 30, 2014

(54) RESISTANCE VARIABLE MEMORY STRUCTURE

(71) Applicant: Taiwan Semiconductor Manufacturing Company, Ltd., Hsinchu (TW)

(72) Inventors: Kuo-Chi Tu, Hsinchu (TW); Wen-Ting Chu, Kaohsiung (TW); Chin-Chieh Yang, New Taipei (TW); Yu-Wen Liao, New Taipei (TW); Hsia-Wei Chen, Taipei (TW); Chih-Yang Chang, Yuanlin Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/673,658

(22) Filed: Nov. 9, 2012

(65) Prior Publication Data

US 2014/0131650 A1 May 15, 2014

(51) Int. Cl.
H01L 47/00 (2006.01)
G11C 11/00 (2006.01)
H01L 45/00 (2006.01)

(52) U.S. Cl.
CPC .............. *H01L 45/146* (2013.01); *H01L 45/08* (2013.01); *H01L 45/1691* (2013.01); *H01L 45/1226* (2013.01)
USPC ................................ 257/4; 438/382; 365/148

(58) Field of Classification Search
None
See application file for complete search history.

(56) References Cited

U.S. PATENT DOCUMENTS

| 7,616,472 | B2 * | 11/2009 | Lai et al. ........................ 365/148 |
| 7,838,861 | B2 | 11/2010 | Klostermann |
| 2004/0113192 | A1 | 6/2004 | Wicker |
| 2004/0166604 | A1 | 8/2004 | Ha et al. |
| 2006/0113521 | A1 | 6/2006 | Lung |
| 2010/0110758 | A1 | 5/2010 | Li et al. |
| 2013/0221308 | A1 * | 8/2013 | Toh et al. ......................... 257/2 |
| 2013/0270501 | A1 * | 10/2013 | Toh et al. ......................... 257/2 |

FOREIGN PATENT DOCUMENTS

| DE | 102004031742 | 1/2006 |
| DE | 102006020179 | 11/2007 |

OTHER PUBLICATIONS

Chien, W. C., et al., "Multi-Layer Sidewall WOx Resistive Memory Suitable for 3D ReRAM", IEEE 2012, pp. 153-154.

* cited by examiner

*Primary Examiner* — Andres Munoz
(74) *Attorney, Agent, or Firm* — Lowe Hauptman & Ham, LLP

(57) ABSTRACT

A semiconductor structure includes a resistance variable memory structure. The semiconductor structure also includes a dielectric layer. The resistance variable memory structure is over the dielectric layer. The resistance variable memory structure includes a first electrode disposed over the dielectric layer. The first electrode has a sidewall surface. A resistance variable layer has a first portion which is disposed over the sidewall surface of the first electrode and a second portion which extends from the first portion away from the first electrode. A second electrode is over the resistance variable layer.

20 Claims, 9 Drawing Sheets

US 8,921,818 B2

RESISTANCE VARIABLE MEMORY STRUCTURE

TECHNICAL FIELD

This disclosure relates generally to a semiconductor structure and, more particularly, to a resistance variable memory structure and method of forming a resistance variable memory structure.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance, rather than electronic charge. Particularly, each RRAM cell includes a resistance variable layer, the resistance of which can be adjusted to represent logic "0" or logic "1".

From an application point of view, RRAM has many advantages. RRAM has a simple cell structure and CMOS logic comparable processes which result in a reduction of the manufacturing complexity and cost in comparison with other non-volatile memory structures. Despite the attractive properties noted above, a number of challenges exist in connection with developing RRAM. Various techniques directed at configurations and materials of these RRAMs have been implemented to try and further improve device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, a semiconductor structure includes a resistance variable memory structure. The resistance variable memory structure includes a resistance variable layer formed between two electrodes. By applying a specific voltage to each of the two electrodes, an electric resistance of the resistance variable layer is altered. The low and high resistances are utilized to indicate a digital signal "1" or "0", thereby allowing for data storage. The switching behavior depends not only on the materials of the resistance variable layer but also on the choice of electrodes and interfacial properties of the electrodes.

According to one or more embodiments of this disclosure, the semiconductor structure having a resistance variable memory structure is formed within a chip region of a substrate. A plurality of semiconductor chip regions is marked on the substrate by scribe lines between the chip regions. The substrate will go through a variety of cleaning, layering, patterning, etching and doping steps to form the semiconductor structures. The term "substrate" herein generally refers to a bulk substrate on which various layers and device structures are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

Figure 1:
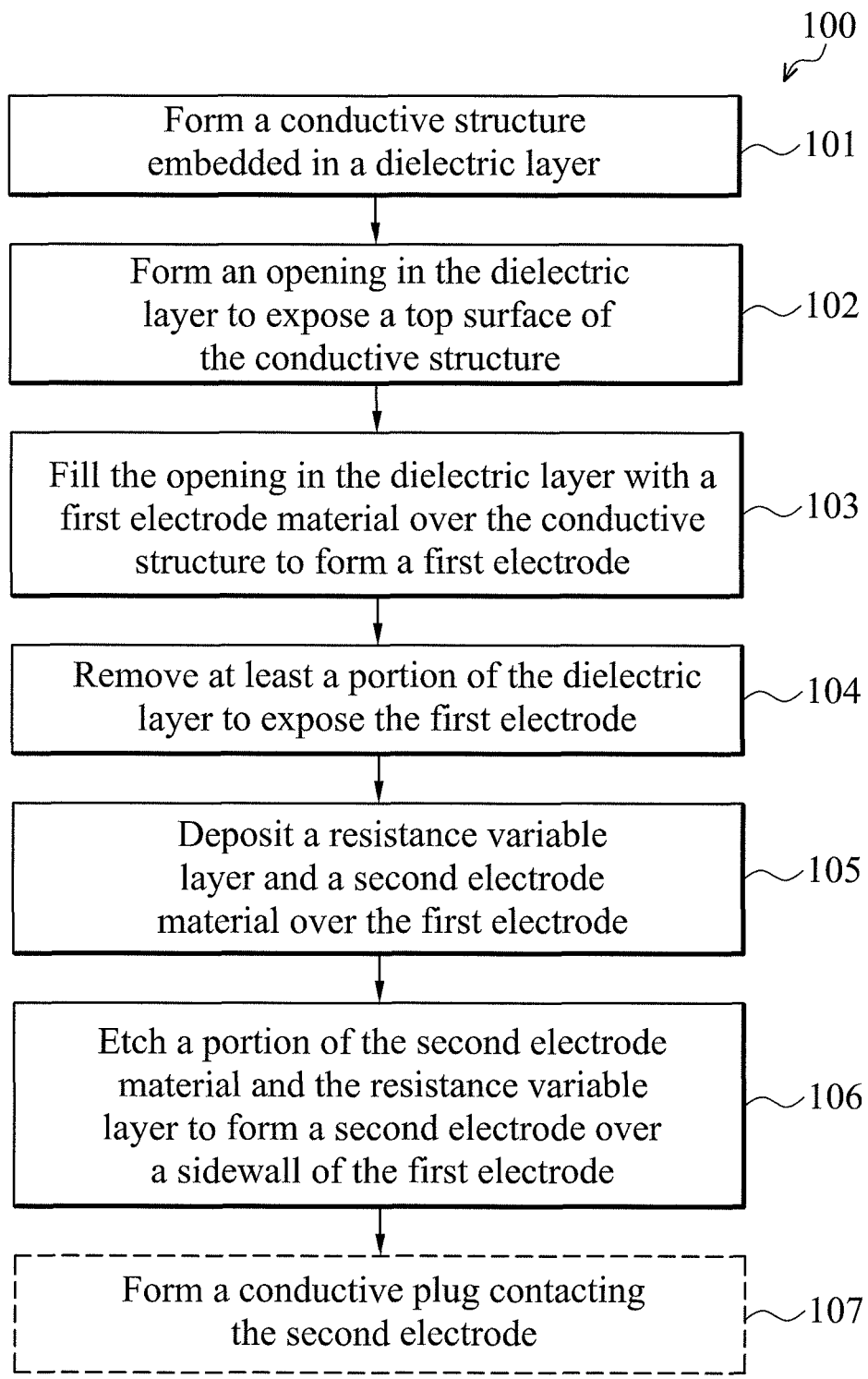
FIG. 1 is a flowchart of a method of forming a semiconductor structure having a resistance variable memory structure according to at least one embodiment of this disclosure.

FIG. 1 is a flowchart of a method 100 of forming a semiconductor structure having a resistance variable memory structure according to at least one embodiment of this disclosure. FIGS. 2A to 2H are cross-sectional views of a semiconductor structure 200 having a resistance variable memory structure at various stages of manufacture according to various embodiments of the method 100 of FIG. 1. Additional processes may be provided before, during, or after the method 100 of FIG. 1. Various figures have been simplified for a better understanding of the inventive concepts of the present disclosure.

Referring now to FIG. 1, the flowchart of the method 100 begins with operation 101. A conductive structure is formed embedded in a dielectric layer. In at least one embodiment, the dielectric layer includes multiple dielectric layers formed over a substrate. At least one conductive structure is formed over the substrate and embedded in multiple dielectric layers.

Figure 2A:
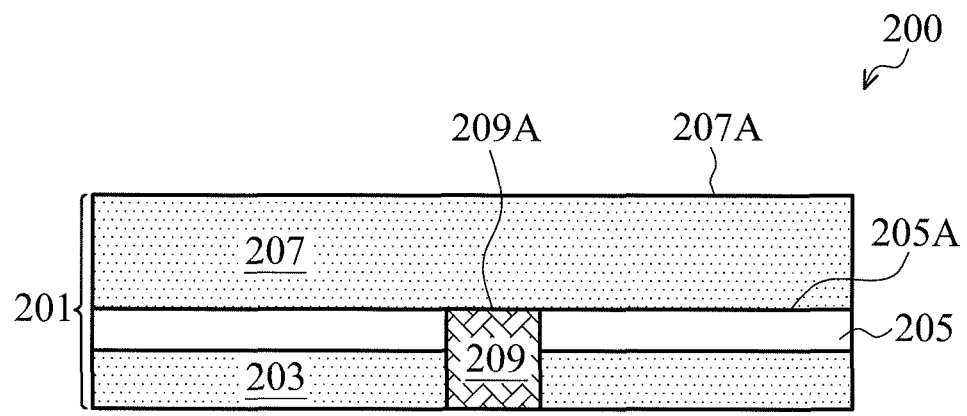
FIGS. 2A to 2H are cross-sectional views of semiconductor structures having a resistance variable memory structure at various stages of manufacture according to one or more embodiments of the method of FIG. 1.

Referring to FIG. 2A, which is an enlarged cross-sectional view of a portion of a semiconductor structure 200 having a resistance variable memory structure after performing operation 101. The semiconductor structure 200 includes a substrate (not shown) such as a silicon carbide (SiC) substrate, GaAs, InP, Si/Ge or a silicon substrate. In some embodiments, the substrate includes a plurality of layers formed over a top surface of the substrate. Examples of the layers include dielectric layers, doped layers, polysilicon layers or conductive layers. The substrate further includes a plurality of device structures formed within the plurality of layers. Examples of the device structures include transistors, resistors, and/or capacitors.

In the illustrated examples of FIGS. 2A-2J, the semiconductor structures 200 include a dielectric layer 201 formed on a top surface of the substrate (not shown). In at least one embodiment, the dielectric layer 201 includes multiple dielectric layers 203, 205 and 207. The dielectric layer 205 has a higher etching resistance compared to the dielectric layer 207 and the dielectric layer 203. The dielectric layers 203, 205 and 207 comprise silicon oxide, fluorinated silica glass (FSG), carbon doped silicon oxide, silicon nitride, silicon oxynitride, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof. The deposition process may include chemical vapor deposition (CVD), atomic layer deposition (ALD), high density plasma CVD (HDPCVD) or spinning on glass.

A conductive structure 209 is formed embedded in the dielectric layer 201 (also in dielectric layers 203, 205 and 207). In certain embodiments, the conductive structure 209 includes a conductive interconnect, a doped region or a silicide region. In some embodiments, the conductive structure 209 includes Al, Cu, Ti, Ta, W, Mo, TaN, NiSi, CoSi, TiN, WN, silicon or combinations thereof. In the illustrated example of FIG. 2A, the semiconductor structure 200 may be formed by lithography patterning and etching in the dielectric layers 203 and 205. A metal layer deposition and planarization processes are performed over the dielectric layers 203 and 205 to form the conductive structure 209. A top surface 209A of the conductive structure 209 is substantially coplanar with a top surface 205A the dielectric layer 205. The dielectric layer 207 having a top surface 207A is formed over the conductive structure 209 and the dielectric layer 205.

Referring back to FIG. 1, method 100 continues with operation 102. In operation 102, an opening is formed in the dielectric layer to expose a top surface of the conductive structure.

Figure 2B:
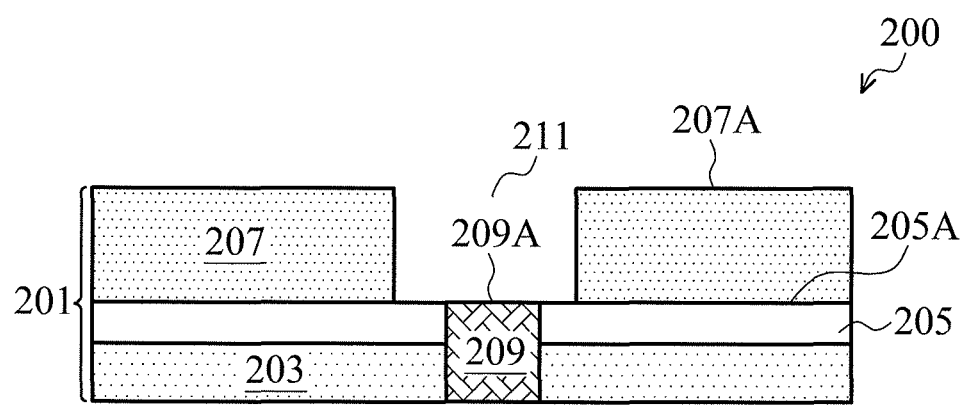

Referring to FIG. 2B, which is an enlarged cross-sectional view of a portion of the semiconductor structure 200 after performing operation 102. An opening 211 is etched in the dielectric layer 207 (also the dielectric layer 201) extending from the top surface 207A of the dielectric layer 207 to the top surface 209A of the conductive structure 209 to expose a portion of the conductive structure 209. A portion of the dielectric layer 205 is also exposed through the opening 211. The opening 211 is formed by suitable process, including lithography patterning, and etching processes.

Referring back to FIG. 1, method 100 continues with operation 103. In operation 103, the opening in the dielectric layer is filled with a first electrode material over the conductive structure to form a first electrode. In at least one embodiment, the opening is filled with the first electrode material substantially to a top surface of the dielectric layer.

Figure 2C:
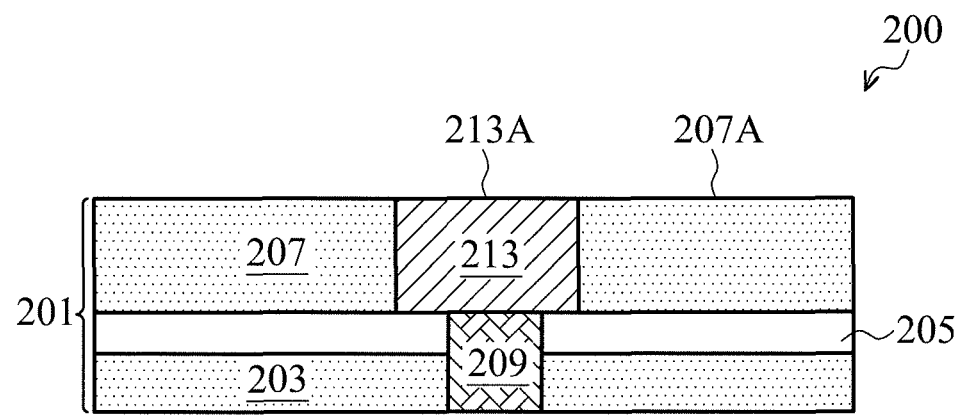

FIG. 2C is a cross-sectional view of the semiconductor structure 200 after performing operation 103. A first electrode 213 is filled in the opening 211 overlying the conductive structure 209. The first electrode 213 includes a first electrode conductive material having a proper work function such that a high work function wall is built between the first electrode 213 and a resistance variable layer subsequently formed. The first electrode 213 may comprise Pt, AlCu, TiN, Au, Ti, Ta, TaN, W, WN, Cu or combinations thereof. In at least one embodiment, the first electrode conductive material may overfill the opening 211 of the dielectric layer 207 (also dielectric layer 201) in FIG. 2B. Possible formation methods include electroless plating, sputtering, electro plating, PVD or ALD. Then, the excess first electrode conductive material outside the opening 211 is removed through a suitable planarization process such as CMP or planarization etching back process. The first electrode 213 is formed in a top section of the dielectric layer 201, and embedded in the dielectric layer 207. The first electrode 213 has a top surface 213A substantially coplanar to the top surface 207A of the dielectric layer 207. The first electrode 213 is electrically connected to an underlying transistor through the conductive structure 209.

Referring back to FIG. 1, method 100 continues with operation 104. In operation 104, at least a portion of the dielectric layer is removed to expose the first electrode.

Figure 2D:
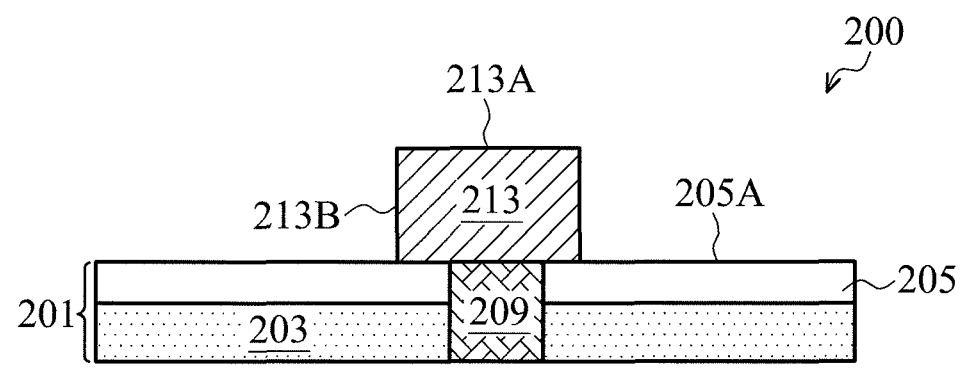

FIG. 2D is a cross-sectional view of the semiconductor structure 200 after a top portion of the dielectric layer 201 (namely, the entire dielectric layer 207) is removed to expose the first electrode 213. An etching process is performed to remove the dielectric layer 207. The etching process may include a dry etching process, wet etching process, or a combination thereof. The dielectric layer 205 has higher etching resistance compared to the dielectric layer 207 during this etching process. The dielectric layer 205 may act as an etching stop layer to remove the dielectric layer 207 above the top surface 205A. Sidewall surfaces 213B of the first electrode 213 above the top surface 205A are exposed after the removal of dielectric layer 207.

Referring back to FIG. 1, method 100 continues with operation 105. In operation 105, a resistance variable layer and a second electrode material are deposited over the first electrode.

Figure 2E:
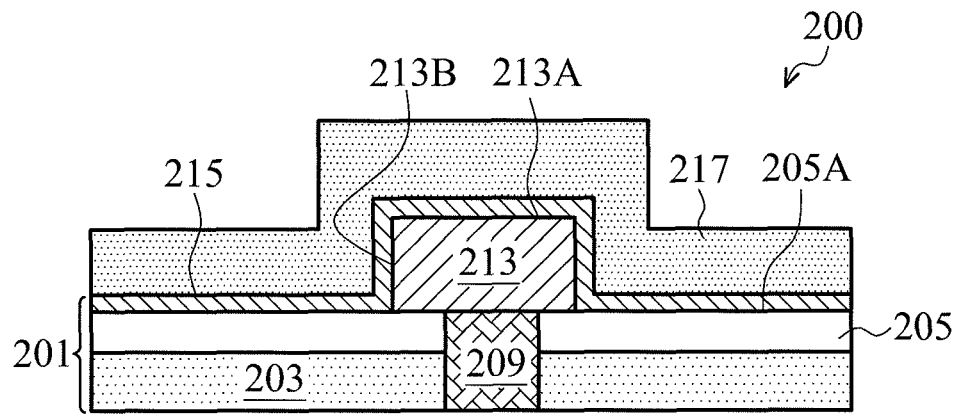

FIG. 2E is a cross-sectional view of the semiconductor structure 200 after performing operation 105. A resistance variable layer 215 is deposited over the top surface 213A and the sidewall surfaces 213B of the first electrode 213, and the top surface 205A of the dielectric layer 205. The resistance variable layer 215 has a resistivity capable of switching between a high resistance state and a low resistance state (or conductive), by application of an electrical voltage. In various embodiments, the resistance variable layer 215 includes at least one of dielectric materials comprising a high-k dielectric material, a binary metal oxide and a transition metal oxide. In some embodiments, the resistance variable layer 215 includes nickel oxide, titanium oxide, hafnium oxide, zirconium oxide, zinc oxide, tungsten oxide, aluminum oxide, tantalum oxide, molybdenum oxide or copper oxide. Possible formation methods include pulse laser deposition (PLD) or ALD, such as ALD with a precursor containing zirconium and oxygen. In one example, the resistance variable layer 215 has a thickness in a range from about 10 angstrom to about 500 angstrom.

A second electrode material 217 is deposited over the resistance variable layer 215. The second electrode material 217 may include suitable conductive material to electrically connect a subsequently formed resistance variable memory structure to other portions of an interconnect structure for electrical routing. The second electrode material 217 may comprise Pt, AlCu, TiN, Au, Ti, Ta, TaN, W, WN, Cu or combinations thereof. In at least one example, the second electrode material 217 has a thickness in a range from about 30 angstrom to about 3000 angstrom. In some embodiments, the first electrode material 213 and the second electrode material 217 have a same composition. In some embodiments, the first electrode material 213 and the second electrode material 217 have different compositions. Possible formation methods include electroless plating, sputtering, electro plating, PVD or ALD.

Referring back to FIG. 1, the method 100 continues with operation 106 in which a portion of the second electrode material and the resistance variable layer are etched to form a second electrode over a sidewall of the first electrode.

Figure 2F:
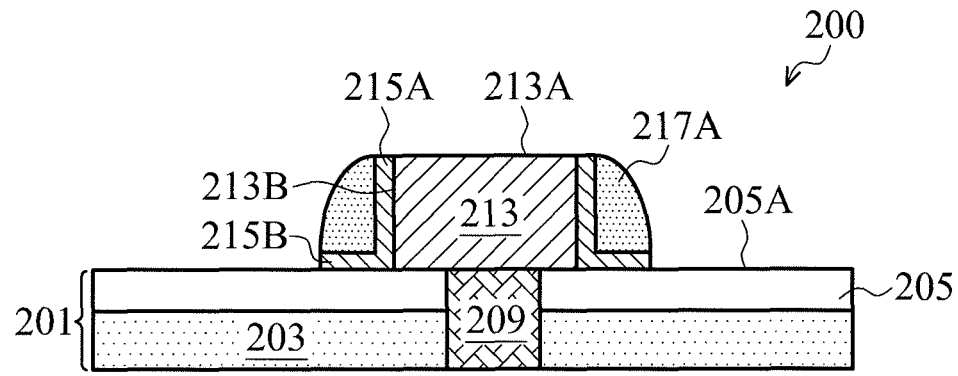

FIG. 2F is a cross-sectional view of the semiconductor structure 200 after performing operation 106. In at least one embodiment, a portion of the second electrode material 217 and the resistance variable layer 215 are anisotropically etched to form a spacer over the sidewall 213B of the first electrode 213 without lithography patterning process. The spacer includes a vertical portion 215A of a remained resistance variable layer 215 over sidewall 213B of the first electrode 213 and a horizontal portion 215B of the remained resistance variable layer 215 over the top surface 205A of the dielectric layer 205. The spacer further includes a second electrode 217A formed over the vertical portion 215A and the horizontal portion 215B of the remained resistance variable layer 215. A resistance variable memory structure including the first electrode 213, the vertical portion 215A and the horizontal portion 215B of the resistance variable layer 215, and the second electrode 217A is formed.

Figure 2G:
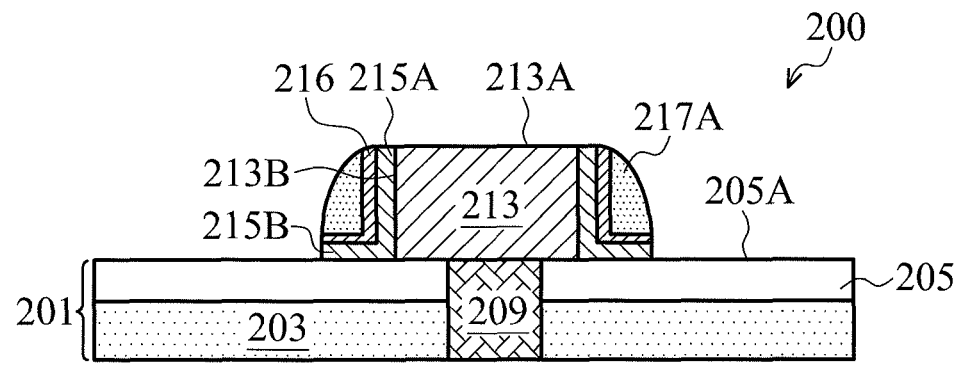

In some examples, the semiconductor structure 200 further includes a cap layer 216 optionally formed over the vertical portion 215A and the horizontal portion 215B of the resistance variable layer 215, and underlying the second electrode 217A as shown in FIG. 2G. The cap layer 216 includes a conductive material that is unstable, capable of depriving oxygen from the resistance variable layer 215, and creates vacancy defects in the resistance variable layer 215. The cap layer 216 comprises titanium, tantalum or hafnium in some embodiments.

Referring back to FIG. 1, the method 100 optionally continues with operation 107 in which a conductive plug is formed contacting the second electrode.

Figure 2H:
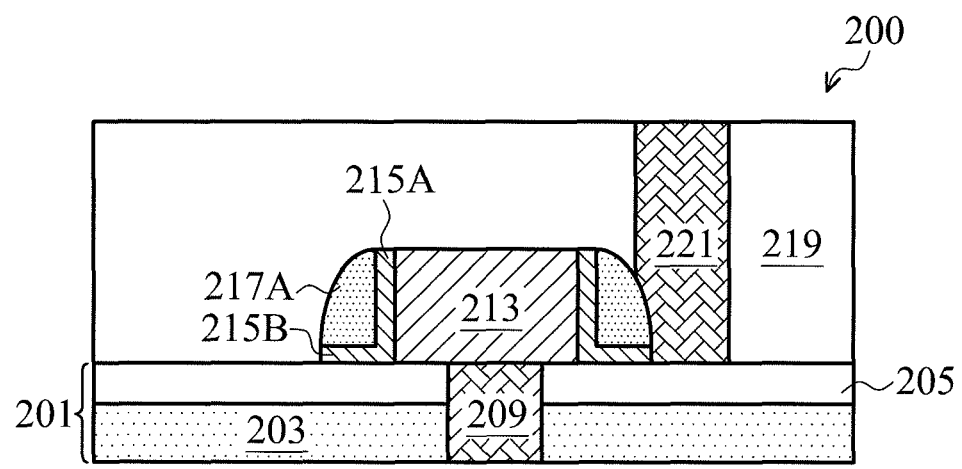

FIG. 2H is a cross-sectional view of the semiconductor structure 200 after performing operation 107. An inter-level dielectric (ILD) layer 219 may be blanket formed over the resistance variable memory structure. A chemical mechanical polishing (CMP) process is further applied to the semiconductor structure 200 to planarize the ILD layer 219. The ILD layer 219 may include multiple dielectric layers. The ILD layer 219 may comprise silicon oxide, fluorinated silica glass (FSG), carbon doped silicon oxide, silicon nitride, silicon oxynitride, TEOS oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof.

An opening is etched in the ILD layer 219 to expose a portion of the second electrode 217A. A conductive material of the contact plug 221 may overfill the opening in the ILD layer 219. The conductive material may include copper, copper alloys, aluminum or tungsten. The possible formation methods include electroless plating, sputtering, electro plating or chemical vapor deposition (CVD). The excess conductive material outside of the opening is removed through a suitable process such as chemical mechanical polishing (CMP). The contact plug 221 having the conductive material is formed contacting the second electrode 217A of the resistance variable memory structure.

Figure 2I:
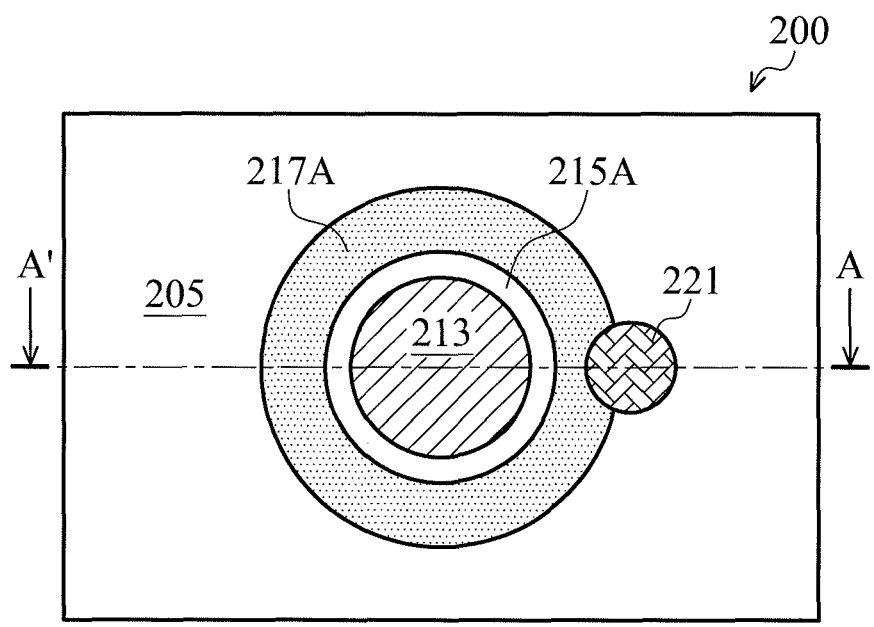
FIG. 2I is a planar view of the semiconductor structure having the resistance variable memory structure of FIG. 2H.

FIG. 2I is a planar view of the semiconductor structure 200. FIG. 2H is the cross-sectional view obtained from a vertical plane crossing line A-A' in FIG. 2I. In FIG. 2I, the first electrode 213 is surrounded by the vertical portion 215A of the resistance variable layer 215. The vertical portion 215A of the resistance variable layer 215 is surrounded by the second electrode 217A. The second electrode 217A is a closed loop surrounding the vertical portion 215A of the resistance variable layer 215 and the first electrode 213. When the semiconductor structure 200 is cut through crossing line A-A' in FIG. 2I, the second electrode 217A is illustrated as two portions on opposite sides of the first electrode 213 in FIG. 2H. The conductive structure 209 in FIG. 2H and the horizontal portion 215B of the resistance variable layer 215 in FIG. 2H are underlying the first electrode 213 and the second electrode 217A, respectively. Hence, the conductive structure 209 and the horizontal portion 215B in FIG. 2H are not shown in FIG. 2I.

Figure 2J:
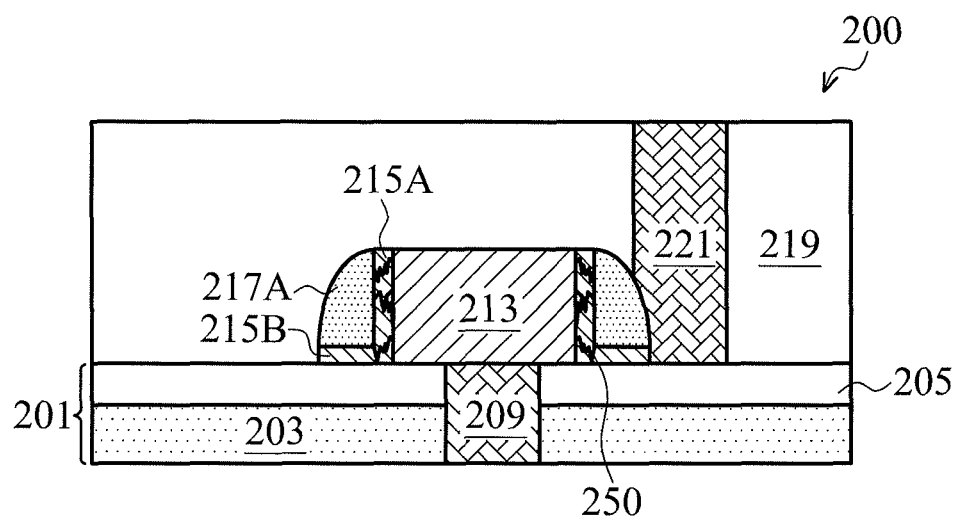
FIG. 2J is a cross-sectional view taken along line A-A' in FIG. 2I to show the semiconductor structure in operation with filaments formed in the resistance variable layer according to one or more embodiments of this disclosure.

FIG. 2J is a cross-sectional view of the semiconductor structure 200 having a resistance variable memory structure in various operations for data storage. In a "forming" operation, a "forming" voltage is applied to the first and second electrodes 213 and 217A of the resistance variable memory structure. The "foaming" voltage is high enough to generate a conductive portion in the vertical portion 215A of the resistance variable layer. In one example, the conductive portion includes one or more conductive filaments 250 to provide a conductive path such that the vertical portion 215A of the resistance variable layer shows an "on" or low resistance state. The conductive path may be related to the lineup of the defect (e.g. oxygen) vacancies in the vertical portion 215A of the resistance variable layer. In some embodiments, the "forming" voltage is applied only one time. Once the conductive path is formed, the conductive path will remain present in the resistance variable layer 215A. Other operations may disconnect or reconnect the conductive path using smaller voltages or different voltages.

In a "reset" operation, a "reset" voltage high enough to break the conductive path in the resistance variable layer 215A is applied to the semiconductor structure 200 such that the resistance variable layer 215A shows an "off" or high resistance state.

In a "set" operation, a "set" voltage high enough to reconnect the conductive path in the resistance variable layer 215A is applied to the resistance variable memory structure such that the resistance variable layer 215A shows the "on" or low resistance state. The "set" operation turns the resistance variable layer 215A to the low resistance state. By applying a specific voltage between two electrodes 213 and 217A, an electric resistance of the resistance variable layer 215A is altered after applying the specific voltage. The low and high resistances are utilized to indicate a digital signal "1" or "0", thereby allowing for data storage.

Figure 3:
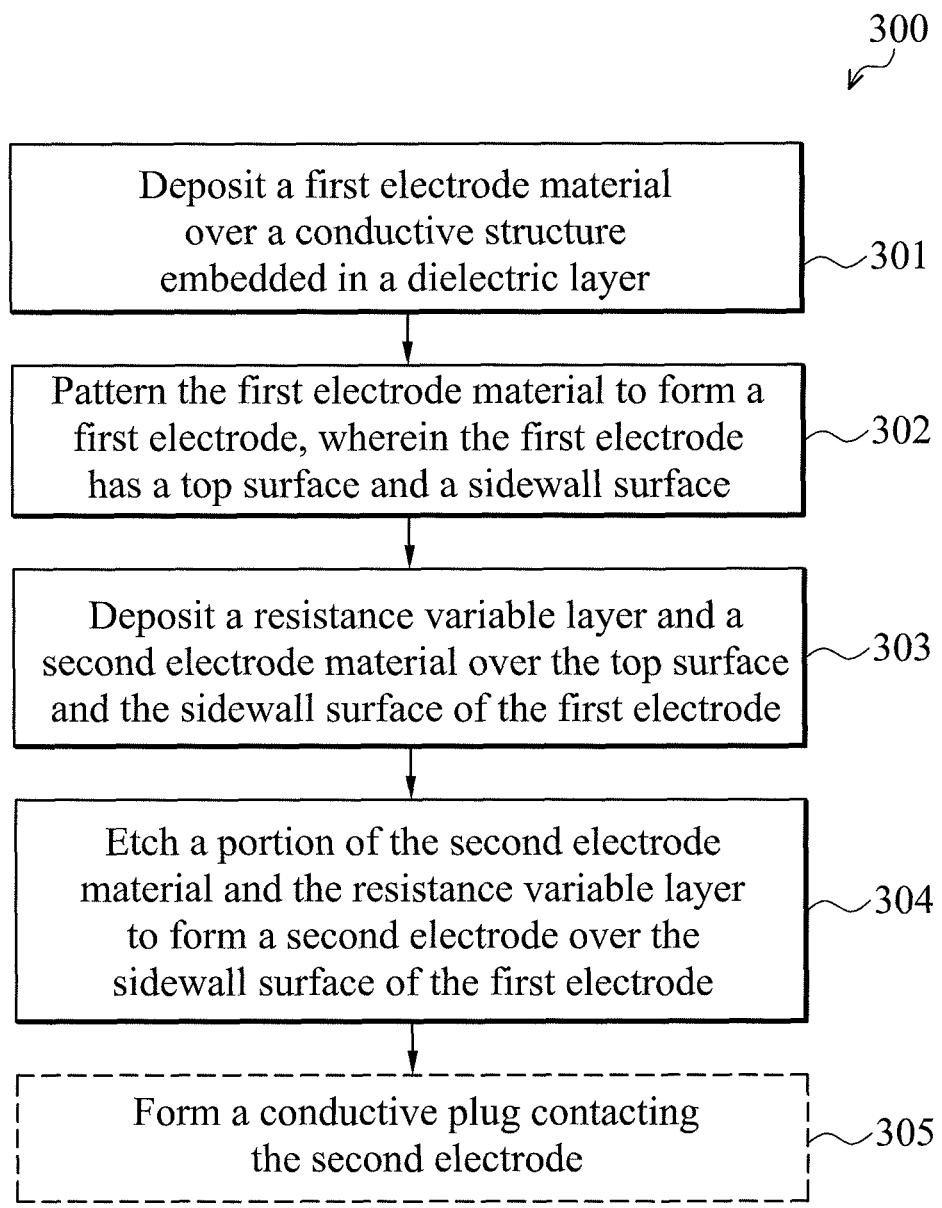
FIG. 3 is a flowchart of a method of forming a semiconductor structure having a resistance variable memory structure according to one or more embodiments of this disclosure.

FIG. 3 is a flowchart of a method 300 of forming a semiconductor structure having a resistance variable memory structure according to one or more embodiments of this disclosure. FIGS. 4A to 4E are cross-sectional views of a semiconductor structure 400 having a resistance variable memory structure at various stages of manufacture according to various embodiments of the method 300 of FIG. 3. Additional processes may be provided before, during, or after the method 300 of FIG. 3. Some of the structures in FIGS. 4A to 4E may be substantially similar to the embodiments disclosed in FIGS. 2A to 2J and the description of the common structures are not repeated here although fully applicable in the following embodiments as well.

Referring now to FIG. 3, the flowchart of the method 300 begins with operation 301. In at least one embodiment, a dielectric layer is formed over a substrate. At least one conductive structure is formed over the substrate and embedded in the dielectric layer. The at least one conductive structure has a portion exposed to a top surface of the dielectric layer. A first electrode material is deposited over the conductive structure and the dielectric layer.

Figure 4A:
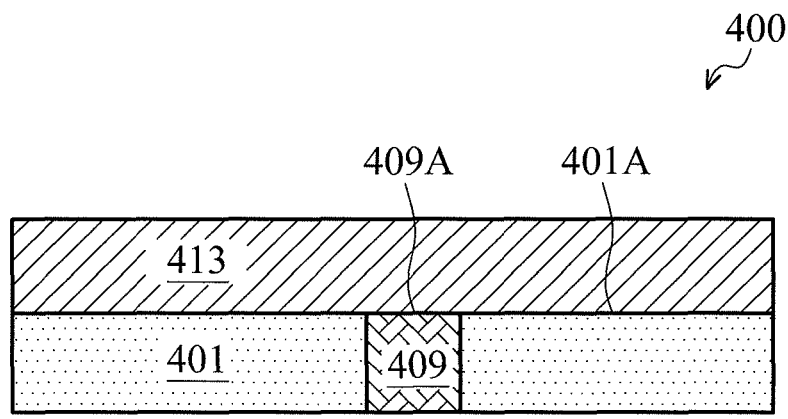
FIGS. 4A to 4E are cross-sectional views of semiconductor structures having a resistance variable memory structure at various stages of manufacture according to one or more embodiments of the method of FIG. 3.

Referring to FIG. 4A, which is a cross-sectional view of a portion of a semiconductor structure 400 having a resistance variable memory structure after performing operation 301. The semiconductor structure 400 includes a substrate (not shown). In the illustrated examples of FIGS. 4A-4E, the semiconductor structures 400 include a dielectric layer 401 formed on a top surface of the substrate (not shown). In at least one embodiment, the dielectric layer 401 includes one or more dielectric layers. Details of the materials and fabrication methods of the substrate and the dielectric layer 401 can be found in the text associated with the dielectric layer 201 in the semiconductor structure 200 and are not repeated here.

A conductive structure 409 is formed embedded in the dielectric layer 401. In some embodiments, the conductive structure 409 includes Al, Cu, Ti, Ta, W, Mo, TaN, NiSi, CoSi, TiN, WN, silicon or combinations thereof. In the illustrated example of FIG. 4A, the semiconductor structure 400 may be formed by lithography patterning and etching an opening in the dielectric layer 401. A metal layer is deposited in the opening and a planarization process is performed over the dielectric layer 401 to form the conductive structure 409. A top surface 409A of the conductive structure 409 is exposed and substantially coplanar with a top surface 401A of the dielectric layer 401.

A first electrode material 413 is deposited over top surfaces (409A and 401A) of the conductive structure 409 and the dielectric layer 401. The first electrode material 413 may comprise Pt, AlCu, TiN, Au, Ti, Ta, TaN, W, WN, Cu or combinations thereof. Possible formation methods include electroless plating, sputtering, electro plating, PVD or ALD. The first electrode material 413 is electrically connected to an underlying transistor through the conductive structure 409.

Referring back to FIG. 3, method 300 continues with operation 302. In operation 302, the first electrode material is patterned to form a first electrode. The first electrode has a top surface and a sidewall.

Figure 4B:
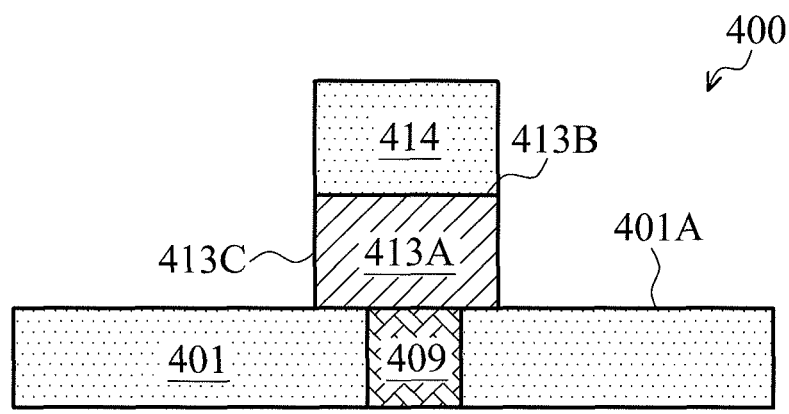

Referring to FIG. 4B, which is a cross-sectional view of a portion of the semiconductor structure 400 after performing operation 302. A mask layer 414 having a feature is formed over the first electrode material 413 and also over the conductive structure 409. The feature is formed by a suitable process, including deposition, lithography patterning, and/or etching processes. An etching process is performed to remove the first electrode material 413 not underlying the feature of the mask layer 414. Then, a first electrode 413A is formed and contacts the conductive structure 409.

The mask layer 414 is removed after the etching process from the semiconductor structure 400 and a top surface 413B of the first electrode 413A is exposed. Also, the first electrode 413A has a sidewall surface 413C connected to the top surface 413B. The removing process may include a dry etching process, wet etching process, or combination thereof.

Referring back to FIG. 3, method 300 continues with operation 303. In operation 303, a resistance variable layer and a second electrode material are deposited over the top surface and the sidewall surface of the first electrode.

Figure 4C:
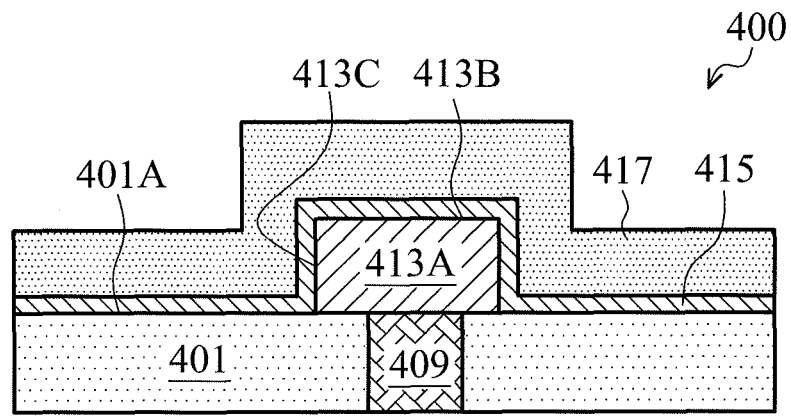

FIG. 4C is a cross-sectional view of the semiconductor structure 400 after performing operation 303. A resistance variable layer 415 is deposited over the top surface 413B and the sidewall surface 413C of the first electrode 413A, and the top surface 401A of the dielectric layer 401. A second electrode material 417 is deposited over the resistance variable layer 415. The second electrode material 417 may include suitable conductive material to electrically connect a subsequently formed resistance variable memory structure to other portions of an interconnect structure for electrical routing. Details of the materials and fabrication methods of the resistance variable layer 415 and the second electrode material 417 can be found in the text associated with the resistance variable layer 215 and the second electrode material 217 in the semiconductor structure 200 and are not repeated here.

Referring back to FIG. 3, the method 300 continues with operation 304 in which a portion of the second electrode material and the resistance variable layer are etched to form a second electrode over a sidewall of the first electrode.

Figure 4D:
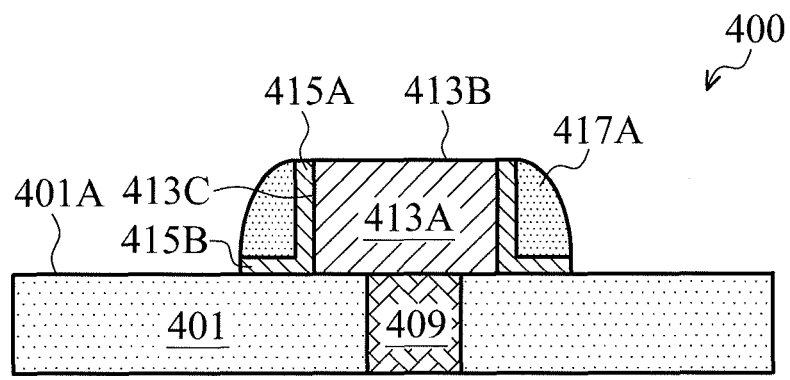

FIG. 4D is a cross-sectional view of the semiconductor structure 400 after performing operation 304. In at least one embodiment, a portion of the second electrode material 417 and the resistance variable layer 415 are anisotropically etched to form a spacer over the sidewall 413C of the first electrode 413A without lithography patterning process. The spacer includes a vertical portion 415A of a remained resistance variable layer 415 over sidewall 413C of the first electrode 413A and a horizontal portion 415B of the remained resistance variable layer 415 over the top surface 401A of the dielectric layer 401. The spacer further includes a second electrode 417A formed over the vertical portion 415A and the horizontal portion 415B of the remained resistance variable layer 415. A resistance variable memory structure including the first electrode 413A, the vertical portion 415A and the horizontal portion 415B of the resistance variable layer 415, and the second electrode 417A is formed.

In some examples, the semiconductor structure 400 further includes a cap layer (not shown) optionally formed over the vertical portion 415A and the horizontal portion 415B of the resistance variable layer 415, and underlying the second electrode 417A. The cap layer includes a conductive material that is unstable, capable of depriving oxygen from the resistance variable layer 415, and creates vacancy defects in the resistance variable layer 415. The cap layer comprises titanium, tantalum or hafnium in some embodiments.

Referring back to FIG. 3, the method 300 optionally continues with operation 305 in which a conductive plug is formed contacting the second electrode.

Figure 4E:
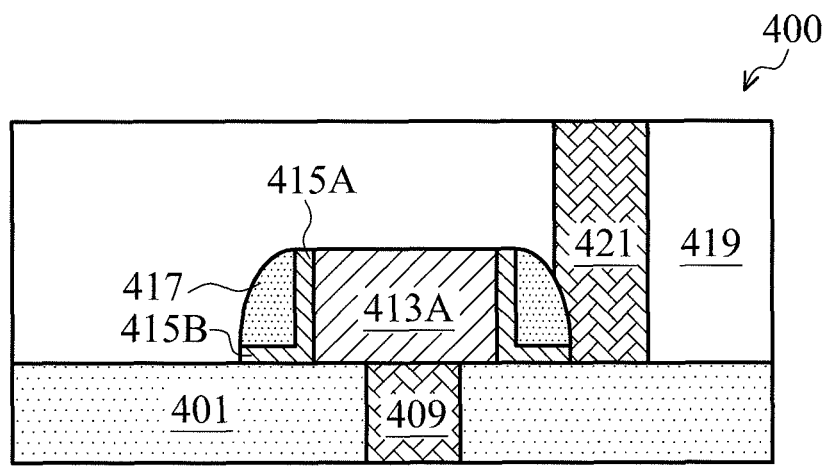

FIG. 4E is a cross-sectional view of the semiconductor structure 400 after performing operation 305. An inter-level dielectric (ILD) layer 419 may be blanket formed over the resistance variable memory structure. A chemical mechanical polishing (CMP) process is further applied to the semiconductor structure 400 to planarize the ILD layer 419. An opening is etched in the ILD layer 419 to expose a portion of the second electrode 417A. A conductive material of a contact plug 421 may overfill the opening in the ILD layer 419. The excess conductive material outside of the opening is removed through a suitable process such as chemical mechanical polishing (CMP). The contact plug 421 having the conductive material is formed contacting the second electrode 417A of the resistance variable memory structure. Details of the materials and fabrication methods of the ILD layer 419 and the contact plug 421 can be found in the text associated with the ILD layer 219 and the contact plug 221 in the semiconductor structure 200 and are not repeated here.

Various embodiments of the present disclosure may be used to improve the processes of a resistance variable memory structure. For example, the first electrode 213 is formed by a filling process in the opening 211 in operation 103. During the formation of the first electrode 213, the disclosed method 100 includes a single lithography patterning process in forming the opening 211 in operation 102. The second electrode 217A is formed by a spacer etching process without lithography patterning process in operation 106. The disclosed method 100 includes a single lithography patterning process (in operation 102) used to form both electrodes 213 and 217A. Likewise, the disclosed method 300 includes a single lithography patterning process in forming the first electrode 413A in operation 302. The second electrode 417A is formed by a spacer etching process without lithography patterning process in operation 304. The disclosed method 300 includes a single lithography patterning process (in operation 302) used to form both electrodes 413A and 417A. This disclosure eliminates drawbacks in other methods which use multiple lithography patterning process steps in patterning both the first and second electrodes. The manufacturing complexity and cost are reduced in accordance with some embodiments.

In another example, a width of the first electrode 213 is determined in the operation 102. The second electrode 217A is formed by a spacer etching process without lithography patterning process. A size of the resistance variable memory structure of the semiconductor structure 200 is determined by the lithography patterning and etching processes capability to from the opening 211 in operation 102. In a view of the lithography patterning and etching processes, reducing a size of the dimension of an opening (or etched portion) in a material layer is simpler than reducing the dimension of a feature (or remained portion) in a material layer. In this disclosure, the width of the first electrode 213 is defined by the opening 211. This disclosure provides an effective technique to facilitate scaling down of the resistance variable memory structure as it is possible to further improve scaling down capability of the lithography patterning.

One aspect of the disclosure describes a semiconductor structure including a resistance variable memory structure. The semiconductor structure also includes a dielectric layer. The resistance variable memory structure is over the dielectric layer. The resistance variable memory structure includes a first electrode disposed over the dielectric layer. The first electrode has a sidewall surface. A resistance variable layer has a first portion over the sidewall surface of the first electrode, and a second portion extending from the first portion away from the first electrode. A second electrode is over the resistance variable layer.

A further aspect of the disclosure describes a semiconductor structure including a resistance variable memory structure. The semiconductor structure also includes a conductive structure. The resistance variable memory structure is over the conductive structure. The resistance variable memory structure includes a first electrode disposed over the conductive structure. The first electrode has a sidewall surface. A resistance variable layer has a vertical portion and a horizontal portion. The vertical portion surrounds the sidewall surface of the first electrode and the horizontal portion extends from the vertical portion away from the first electrode. A second electrode is over the resistance variable layer and surrounds the vertical portion of the resistance variable layer.

The present disclosure also describes an aspect of a method of forming a resistance variable memory structure. The method includes forming a first electrode over a dielectric layer. The first electrode has a top surface and a sidewall surface extending downward from the top surface toward the dielectric layer. A resistance variable material and a second electrode material are deposited over the top surface and the sidewall surface of the first electrode. A portion of the resistance variable material and the second electrode material are etched to form a resistance variable layer and a second electrode over the sidewall surface of the first electrode.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
    a dielectric layer; and
    a resistance variable memory structure over the dielectric layer, the resistance variable memory structure comprising:
        a first electrode disposed over the dielectric layer, the first electrode having a sidewall surface;
        a resistance variable layer having a first portion in physical contact with the sidewall surface of the first electrode and a second portion which extends from the first portion away from the first electrode; and
        a second electrode disposed over the resistance variable layer, wherein the second electrode is a closed loop surrounding the resistance variable layer and the first electrode.

2. The semiconductor structure of claim 1, wherein the second portion of the resistance variable layer is disposed between the second electrode and the dielectric layer.

3. The semiconductor structure of claim 2, wherein the first portion is selectively configurable to form at least one conductive path between the first electrode and the second electrode.

4. The semiconductor structure of claim 1, further comprising a cap layer disposed between the resistance variable layer and the second electrode.

5. The semiconductor structure of claim 4, wherein the cap layer comprises titanium, tantalum or hafnium.

6. The semiconductor structure of claim 4, wherein the cap layer is configured to deprive oxygen from the resistance variable layer and create vacancy defects in the resistance variable layer.

7. The semiconductor structure of claim 1, further comprising a conductive structure embedded in the dielectric layer, and electrically connected to the first electrode.

8. The semiconductor structure of claim 1, wherein each of the first electrode and the second electrode comprises at least one material selected from the group consisting of Pt, AlCu, TiN, Au, Ti, Ta, TaN, W, WN, and Cu.

9. The semiconductor structure of claim 1, wherein the resistance variable layer comprises a high-k dielectric material, a binary metal oxide or a transition metal oxide.

10. The semiconductor structure of claim 1, wherein the resistance variable layer comprises nickel oxide, titanium oxide, hafnium oxide, zirconium oxide, zinc oxide, tungsten oxide, aluminum oxide, tantalum oxide, molybdenum oxide or copper oxide.

11. A semiconductor structure, comprising:
    a conductive structure, wherein the conductive structure comprises a metal; and
    a resistance variable memory structure over the conductive structure, the resistance variable memory structure comprising:
        a first electrode disposed over the conductive structure, the first electrode having a sidewall surface;
        a resistance variable layer having a vertical portion and a horizontal portion, wherein the vertical portion surrounds the sidewall surface of the first electrode and the horizontal portion extends from the vertical portion away from the first electrode; and
        a second electrode disposed over the resistance variable layer and surrounding the vertical portion of the resistance variable layer, wherein the second electrode is a closed loop surrounding the resistance variable layer and the first electrode.

12. The semiconductor structure of claim 11, wherein the vertical portion is selectively configurable to form at least one conductive path between the first electrode and the second electrode.

13. The semiconductor structure of claim 11, further comprising a cap layer between the resistance variable layer and the second electrode.

14. The semiconductor structure of claim 13, wherein the cap layer comprises titanium, tantalum or hafnium.

15. The semiconductor structure of claim 11, wherein the resistance variable layer comprises a high-K dielectric material, a binary metal oxide or a transition metal oxide.

16. The semiconductor structure of claim 11, wherein each of the first electrode and the second electrode comprises at least one material selected from the group consisting of Pt, AlCu, TiN, Au, Ti, Ta, TaN, W, WN, and Cu.

17. The semiconductor structure of claim 11, further comprising a conductive plug disposed over the second electrode and contacting the second electrode.

18. The semiconductor structure of claim 11, further comprising first and second dielectric layers underlying the resistance variable memory structure, wherein the first dielectric layer is disposed over the second dielectric layer and has a higher etching resistance than the second dielectric layer.

19. A semiconductor structure, comprising:
 a dielectric layer; and
 a resistance variable memory structure over the dielectric layer, the resistance variable memory structure comprising:
  a first electrode disposed over the dielectric layer;
  a resistance variable layer surrounding and in physical contact with the first electrode; and
  a second electrode surrounding the resistance variable layer and the first electrode;
 wherein the resistance variable layer has a portion disposed below an entirety of the second electrode.

20. The semiconductor structure of claim 19, further comprising:
 a cap layer between the resistance variable layer and the second electrode, the cap layer configured to deprive oxygen from the resistance variable layer and create vacancy defects in the resistance variable layer.

* * * * *